US009028242B2

(12) United States Patent
Muhammad et al.

(10) Patent No.: US 9,028,242 B2
(45) Date of Patent: May 12, 2015

(54) TEMPLATE AND METHOD OF MAKING HIGH ASPECT RATIO TEMPLATE FOR LITHOGRAPHY AND USE OF THE TEMPLATE FOR PERFORATING A SUBSTRATE AT NANOSCALE

(75) Inventors: Amin Saleem Muhammad, Göteborg (SE); David Brud, Henån (SE); Jonas Berg, Hyssna (SE); Mohammad Shafiqul Kabir, Göteborg (SE); Vincent Desmaris, Göteborg (SE)

(73) Assignee: Smoltek AB, Gothenburg (SE)

( * ) Notice: Subject to any disclaimer, the term of this patent is extended or adjusted under 35 U.S.C. 154(b) by 509 days.

(21) Appl. No.: 13/057,508

(22) PCT Filed: Jul. 23, 2009

(86) PCT No.: PCT/EP2009/005340
§ 371 (c)(1),
(2), (4) Date: Mar. 17, 2011

(87) PCT Pub. No.: WO2010/015333
PCT Pub. Date: Feb. 11, 2010

(65) Prior Publication Data
US 2011/0195141 A1     Aug. 11, 2011

(30) Foreign Application Priority Data
Aug. 5, 2008   (SE) .................................... 0801770

(51) Int. Cl.
*B29C 59/02*  (2006.01)
*B05D 5/00*   (2006.01)
*G03F 7/00*   (2006.01)
(Continued)

(52) U.S. Cl.
CPC ............... *G03F 7/0002* (2013.01); *B82Y 10/00* (2013.01); *B82Y 40/00* (2013.01); *Y10S 977/932* (2013.01)

(58) Field of Classification Search
CPC ........ B82Y 30/00; B82Y 40/00; B82Y 10/00; B29C 59/02; B29C 59/022
USPC ........................... 264/219; 425/385; 977/932
See application file for complete search history.

(56) References Cited

U.S. PATENT DOCUMENTS 5,772,905 A   6/1998   Chou
6,309,580 B1  10/2001  Chou
(Continued)

FOREIGN PATENT DOCUMENTS

JP   2005-052956 A   3/2005
JP   2007-044831 A   2/2007
(Continued)

OTHER PUBLICATIONS

International Search Report (PCT/ISA/210) issued on Mar. 18, 2010, by European Patent Office as the International Searching Authority for International Application No. PCT/EP2009/005340.
(Continued)

*Primary Examiner* — Joseph S Del Sole
*Assistant Examiner* — Nahida Sultana
(74) *Attorney, Agent, or Firm* — Buchanan Ingersoll & Rooney P.C.

(57) ABSTRACT

Template and method of making high aspect ratio template, stamp, and imprinting at nanoscale using nanostructures for the purpose of lithography, and to the use of the template to create perforations on materials and products.

12 Claims, 8 Drawing Sheets (51) Int. Cl.
   *B82Y 10/00*        (2011.01)
   *B82Y 40/00*        (2011.01)

(56)                References Cited

U.S. PATENT DOCUMENTS

| | | | |
|---|---|---|---|
| 6,943,117 | B2 | 9/2005 | Jeong et al. |
| 7,080,596 | B2 | 7/2006 | Lee et al. |
| 7,591,641 | B2 * | 9/2009 | Saito et al. .................. 425/385 |
| 7,696,837 | B2 * | 4/2010 | Emrick et al. ............... 333/24 R |
| 8,030,833 | B2 * | 10/2011 | Choi et al. .................... 313/311 |
| 8,178,165 | B2 * | 5/2012 | Jin ................................ 427/287 |
| 2001/0003384 | A1 * | 6/2001 | Morita ........................... 264/219 |
| 2003/0185985 | A1 * | 10/2003 | Bronikowski et al. ........ 427/258 |
| 2004/0082178 | A1 * | 4/2004 | Kamins et al. ................ 438/691 |
| 2005/0191774 | A1 * | 9/2005 | Li et al. ............................ 438/22 |
| 2006/0131695 | A1 * | 6/2006 | Kuekes et al. ................. 257/618 |
| 2007/0176320 | A1 * | 8/2007 | Nakamura et al. ............ 264/219 |
| 2007/0232028 | A1 * | 10/2007 | Lee et al. ........................ 438/478 |
| 2008/0018875 | A1 | 1/2008 | Schram et al. |
| 2008/0211133 | A1 * | 9/2008 | Terasaki et al. ............... 264/219 |
| 2008/0260941 | A1 | 10/2008 | Jin |
| 2008/0271606 | A1 * | 11/2008 | Holmes et al. .................. 96/132 |
| 2008/0315430 | A1 * | 12/2008 | Weber et al. ................... 257/774 |
| 2009/0045720 | A1 * | 2/2009 | Lee et al. ........................ 313/503 |
| 2009/0047478 | A1 | 2/2009 | Zhang et al. |
| 2009/0166914 | A1 | 7/2009 | Ogino et al. |
| 2009/0304992 | A1 | 12/2009 | Desimone et al. |
| 2010/0109205 | A1 * | 5/2010 | Fletcher et al. ............... 264/447 |
| 2010/0171093 | A1 * | 7/2010 | Kabir .............................. 257/10 |
| 2011/0104321 | A1 * | 5/2011 | Zhang et al. .................. 425/385 |
| 2012/0021250 | A1 * | 1/2012 | Lee et al. ........................ 428/688 |
| 2012/0228804 | A1 * | 9/2012 | Shida et al. .................... 264/447 |
| 2013/0052583 | A1 * | 2/2013 | Keszler et al. .............. 430/270.1 |
| 2014/0021444 | A1 * | 1/2014 | Yi et al. ........................... 257/24 |
| 2014/0144881 | A1 * | 5/2014 | Lee et al. ....................... 216/100 |
| 2014/0293436 | A1 * | 10/2014 | Nagahama et al. ........... 359/634 |

FOREIGN PATENT DOCUMENTS

| | | | |
|---|---|---|---|
| JP | 2007-069604 | A | 3/2007 |
| WO | 2006-115453 | A1 | 2/2006 |
| WO | WO 2006/028282 | A1 | 3/2006 |
| WO | 2006-078952 | A | 7/2006 |
| WO | WO 2006/078952 | A1 | 7/2006 |
| WO | WO 2006078952 | A1 * | 7/2006 ............... B05D 5/00 |
| WO | WO 2006/115453 | A1 | 11/2006 |
| WO | WO 2007/046772 | A1 | 4/2007 |
| WO | WO 2007/133235 | A2 | 11/2007 |

OTHER PUBLICATIONS

Guo L.J., "Recent progress in nanoimprint technology and its applications", Journal of Physics D. Applied Physics, vol. 37, No. 11, May 12, 2004, pp. 123-141.

Nakamatsu K. et al., "Effect of UV Irradiation on Organic-SOG Patterns Replicated by Room-Temperature Nanoimprinting", Microprocesses and Nanotechnology, Nov. 5, 2007, pp. 302-303.

Kehagias N. et al., "3D nanofabrication by reverse contact UV nanoimprint lithography", Microprocesses and Nanotechnolgy, Nov. 5, 2007, pp. 408-409.

Won Mook Choi et al., "A soft-imprint technique for submicron structure fabrication via in situ polymerization; A structure fabrication via in situ polymerization", Nanotechnology, vol. 15, No. 1, Jan. 1, 2004, pp. 135-138.

* cited by examiner

After imprinting        Transferred dots pattern after metal deposition

TEMPLATE AND METHOD OF MAKING HIGH ASPECT RATIO TEMPLATE FOR LITHOGRAPHY AND USE OF THE TEMPLATE FOR PERFORATING A SUBSTRATE AT NANOSCALE

FIELD OF THE INVENTION

The present invention relates to a template and a method of forming a high aspect ratio template for lithography and use of the template for perforating a substrate at nanoscale.

BACKGROUND OF THE INVENTION

The miniaturization of CMOS devices has hitherto been governed by a trend—often called Moore's law—in which electronic components shrink in size by half every 2 years. The International Technology Roadmap for Semiconductors (ITRS) has established a projected growth curve according to this model. The demands for speed, high integration level, high performance and low production costs attendant on such a rate of progress are very stringent. Consequently, the problems associated with the demand in decreasing feature size have escalated and among many problems, lithographically transferring pattern at the nanoscale is eminent. Hence there is a need to search for alternative solutions to the problems that will ultimately impede the progress of silicon technology in the immediate future. This means that devising new method of low cost, mass production compatible pattern transfer solution is critical to sustaining the projected rate of growth. Lithography is an important process when manufacturing integrated circuits, and is used to transfer patterns from layer to layer. Today's widespread used optical lithography technology is approaching its fundamental limits governed by the optics, wave length, lens etc. and has to rely on expensive equipment to coup up with present demands. One alternative to such traditional lithography method is nanoimprint lithography described in patent U.S. Pat. No. 5,772,905, where a stamp with nanoscale features is pressed into a thermoplastic polymer. In this particular patent, the stamp was made by etching the substrate to create the patterns to be transferred and typical metal, dielectric or semiconductor bulk material are used for creating the mold. The stamp is sometimes labeled mould, mould, die or template, and nanoimprint lithography is sometimes referred to as "imprint lithography". The polymer is heated while imprinted with the stamp. After cooling the stamp is removed from the polymer, which now has imprinted nanoscale features. This process is described in FIG. 1, where the stamp 100 has protrusions 102. These protrusions are typically manufactured from silicon based material.

Figure 1A:
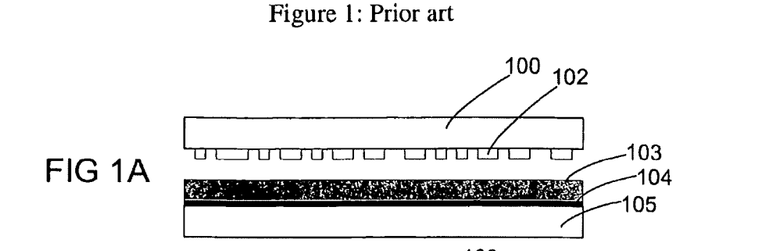
FIG. 1 PRIOR ART. Drawing of standard nanoimprint.
Figure 1B:
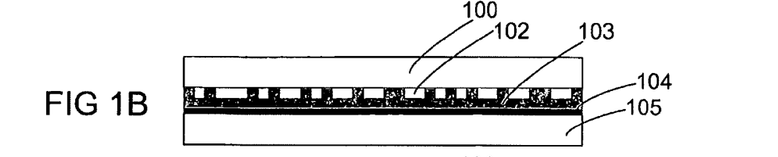
Figure 1C:
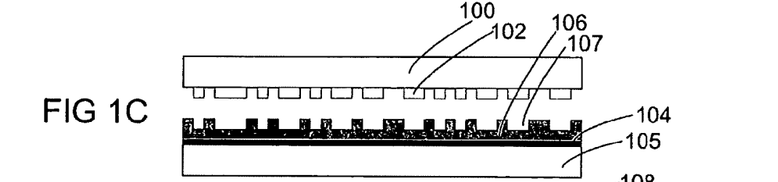
Figure 1D:
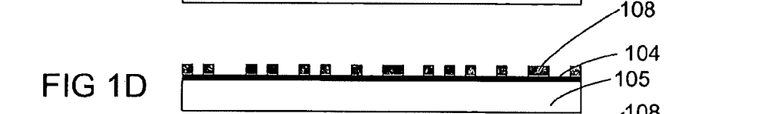
Figure 1E:
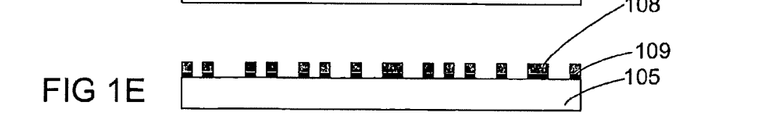
Figure 1F:
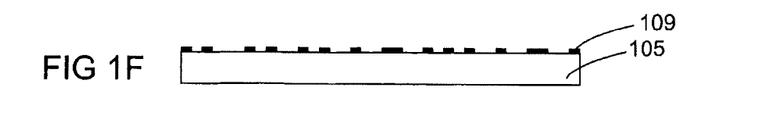

A wafer 105 with a layer 104 to be patterned and a deposited resist layer 103 is also seen in the FIG. 1A. FIG. 1B shows the stamp pressed toward the polymer coated wafer, which has been heated to a temperature above the glass transition temperature of the polymer. After cooling, the stamp is lifted and depressions 107 are present in the now patterned resist layer 103, as seen in FIG. 1C. Plasma etching is utilized to remove the unwanted residuals to achieve 108 of the polymer layer, see FIG. 1D. Using the polymer as a mask, the layer 104 (into 109) is patterned by etching and the result is seen in FIG. 1E. The remaining polymer is removed, as seen in FIG. 1F. Instead of etch back processing, a lift-off processing can be used. Then the metal layer is deposited on top of the patterned resist layer, and the unwanted parts of the metal layer (which is on top of the resist) are removed by lifting off the resist.

Today's nanoimprinting stamps suffer from poor releasing mechanism from the resist layer. However, several improvements of the technique have been presented in patent U.S. Pat. No. 6,309,580 where they have described the use of an anti-sticking material applied to the stamp, to improve the release properties. To increase the releasing properties even further, in WO2006/028282 carbon nanowalls are used on the mold. Another improvement of stamps life time was described in the patent U.S. Pat. No. 7,080,596 by using SiC substrate as stamp material. A third improvement of the stamp is described in paten U.S. Pat. No. 6,943,117 where Ultra violet radiation (UV) imprint lithography is introduced in order to avoid pressure and issues due to contacting during standard nanoimprint. In this method a transparent substrate is used and implementing high pressure is avoided. However, the method is limited to working only for UV transparent substrates.

A grown nanostructure is an object of intermediate size between molecular and microscopic (micrometer-sized) structures. The last decade a number of different types of nanostructures have been investigated. One important aspect of the nanostructures is its anisotropic properties, meaning the properties vary substantially in different direction of the structures. For example, carbon nanostructures are considered to be one of the most promising candidates for future developments in nano-electronics, nano-electromechanical systems (NEMS), sensors, contact electrodes, nanophotonics, and nano-biotechnology. This is due principally to their one dimensional nature, and their unique electrical, optical and mechanical properties. Carbon nanotubes and carbon nanofibers have been considered for both active devices and as interconnect technology at least because their electrical and thermal properties and their strength. For example, the high electron mobility of carbon nanotubes (79,000 $cm^2/Vs$) surpasses that of state-of-the-art MOSFET devices. Finally, high E-modulus (representing the strength of a material) of individual nanostructures as high as 1 TPa have been reported along its axis. However, the E-modulus in transverse axis is orders of magnitude smaller. Therefore, carbon nanotubes and carbon nanofibers are a good choice for applications where high strength is required.

However, to our knowledge, no one has recognized the use of grown nanostructures as apparatus for manufacturing template/mold/apparatus for imprint technology to provide high aspect ratio, recyclable, reworkable templates/mold/apparatus with a resolution covering from macro scale down to a nanometer scale. Furthermore, the possibility of developing a lithographic method that combines imprint technology and nanostructure growth technologies to replace the conventional lithography technologies used in industries has never been recognized.

Moreover, a template with nanostructures has never been used for perforating a substrate.

Problems Definitions

Substrate choice: The typical base substrate that is used to manufacture stamps is silicon which is a soft and brittle material and subject to breakage, damage and wear from repeated processing steps (Lee et al., U.S. Pat. No. 7,080, 596). Therefore, Lee et al. (U.S. Pat. No. 7,080,596) have improved the stamps properties by using stronger material with high E-modulus, SiC, in order to improve the life time of the stamps. However, the choice of the material is still a three dimensional bulk material with isotropic materials properties. The other choices of materials are silicon oxide, silicon nitride or metals which also essentially exhibit poor isotropic E-modulus properties. Moreover, the problem with SiC materials is inherent difficulties in processing to form the stamps and associated processing complexity and very costly substrate to purchase as starting substrate materials. Jun-ho Jeong et al. have introduced a different approach in U.S. Pat. No. 6,943,117 where ultra violet radiation (UV) together with imprint lithography is described. Here the purpose is to to avoid pressure and issues due to contact with the polymer layer during standard nanoimprint. In this method a transparent substrate is used and implementing high pressure is avoided. However, the method is limited to working only for UV transparent substrates and is UV dependent. Furthermore, the method requires attaching a template on the transparent substrate which involves more sophisticated processing, gluing and detachment. In our present invention, we are adding a third dimension to the improvement of the stamps properties by utilizing anisotropic materials for template fabrication which enable recyclable, reworkable templates and independent of substrate choice and not dependent on radiation. However, radiation can be used as additional function together with the stamps according to the present invention.

Limitations in aspect ratio and pitch: By today's methods it is not possible to manufacture high aspect ratio (higher than i.e. 1:10) structures with a small pitch due to (a) high aspect ratio structures provides a poorly mechanically stable template which breaks (shorter life time) under processing, (b) time consuming complex processing is involved for manufacturing highly vertical structures and (c) reproducibility become poor and become non-economical. Also for practical applications for electronics, today the aspect ratio of contact holes for interconnects in DRAM staked capacitors has reached 12:1 and is expected to increase to 23:1 by the year 2016. Creating such high aspect ratio contacts with straight walls poses substantial technological challenges, not least because void-free filling with metals (also known as vias) of such high aspect ratio features is extremely difficult.

Not possible to use thick resist: Due to the aspect ratio that is achievable with today's technology, it is not possible to use thick resist as imprinting material due to the fact that the imprinting pillars cannot penetrate all through the resist layer. Thus the standard stamps become impractical to work with standard lithography resists or thick resists layer for pattern transfer which is important for standard lithography/pattern transfer purposes.

Not recyclable: Today's substrates used for making stamps or templates for imprinting are made of brittle silicon wafers. The substrate are usually thrown away when the stamp or template become unusable. The draw back with a SiC substrate it that it is a material too hard to be reprocess and requires rigorous processing steps (a pillar or structure may be broken due to use of the stamp many times) and thus the SiC substrate is not practical to recycle.

Not re-workable: Independent of substrate, when a protruding part according to the FIG. 1 (standard method) is broken due to processing, the stamp becomes essentially useless and reworking of the template (removing the present layout, manufacturing/transferring the design again on the same substrate, typically expensive e-beam lithography is used for pattern transfer) becomes virtually impossible due to technical problems and cost associated with the processes. According to the present invention, the templates are re-workable by removing the existing nanostructures pattern by simple sonication or by chemical etching or by chemical mechanical polishing and then re-grow the nanostructure from the same places and thereby obtain a template as before.

Large waste generation: Today's technology is limited to re-use the substrate or re-fabricate the template on the same substrate and therefore produce a large quantity of waste by throwing no re-workable substrates and stamps and therefore making it less environmentally friendly. According to the present invention, it will be possible to re-use and re-work to a large extend (unless the substrate is totally broken into pieces i.e. silicon) such that the technology become more environmentally friendly. Furthermore, according to the present invention, any substrate that is not brittle can be used as substrate/base substrate and can be used over and over again to re-create the templates on the same substrate/base substrate.

Industrial applicability: In general, it is highly desirable to fabricate nanoscale templates that are compatible with existing complementary metal oxide semiconductor (CMOS) fabrication techniques. A prerequisite for exploring nanostructure in an industrial process is to be able to control mass production of devices with high reproducibility. According to the present invention, the method described herein uses standard chemical vapor deposition (CVD) to grow such nanostructures with extreme high yield with control over exact location, their length, diameter, shape and orientation. According to the present invention, templates can be manufactured at a given CMOS foundry and making the invented technology industrially applicable.

Consequently there exists a need for a nanoscale template that is recyclable and reworkable making templates and minimizes waste management and increases the life time of the template without sacrificing the nanoscale resolution. Apart from that there is a need for high aspect ratio (higher than 1:20) structures for memory elements, nanoimprinting, embossing, highly ordered perforated materials at nanoscale.

SUMMARY OF THE INVENTION

The object of the invention is to eliminate totally or at least partially the above-identified problems.

In an aspect this is achieved according to the invention by providing a template or stamp at nanoscale with characteristics including (a) high aspect ratio, (b) re-workable (c) recyclable and (d) controllable shape of a nanoimprint template or stamp. The template or stamp comprises a base substrate, instead of processing the substrate to create the templates, a catalyst layer deposited on the substrate. Thereafter, at least one nanostructure is grown from the catalyst layer defining a lithography profile (template/stamp/mold). In one aspect of the invention, the aspect ratio of the nanostructure can be controlled by growth of nanostructure. According to the present invention, the hardness of the nanostructure is higher than typically used in silicon, or silicon oxide or silicon nitride. The nanostructure has high Young modulus to sustain the lithography profile of the nanostructure under vertical pressure. According to the present invention, in one aspect of the invention the nanostructures based template can withstand vertical pressure between 1 Bar to above 200 Bar and preferably between 1 Bar to 60 Bar.

The present invention enables to (a) produce high aspect ratio templates for lithography, (b) eliminates for the need of using only thin resist layer as stamping layer for pattern transfer, (c) replicate the template pattern with different controlled properties such as shape, diameter, length, different aspect ratio, (d) enable to manufacture high aspect ratio semi/full perforated materials, (f) enable to manufacture controllable low k-dielectric materials, (g) recyclable imprinting stamp/template, (h) re-workability enabled environmentally friendly templates where the life time of the substrate and the template is increased by many factors. These capabilities of the present invention is unattainable with the prior art.

Any solid, metal, semi-metal, ceramic or polymer substrate can be used for producing such template according to our invention. The typical substrate that are used in electronics industries are silicon, oxidized silicon, silicon nitride, silicon carbide, ITO, GaN, GaAs and polymers. Any optically transparent substrate such as ITO, quartz, glass, sapphire and diamond can be used. Any polymer such as polyimide, epoxies, PDMS, SU8, SAL601, can be used as substrate. Any metal from the periodic table can be used. Some typical metals such as copper (Cu), tungsten (W), molybdenum (Mo), platinum (Pt), palladium (Pd), tantalum (Ta), osmium (Os), chromium (Cr), Ti, iron, cobalt (Co), nickel (Ni), are effective. Any metallic alloys and compounds of those are also effective, for example, NiCr, constantan (CuNi), stainless steel etc.

In one aspect of the invention, the nanostructures can be grown from predefined catalyst if the growth is catalytically controlled. However, catalyst free growth is also anticipated. A method of growing and controlling properties of nanostructures is disclosed in the patent application WO 2006115453 where a plurality of materials are used for controlling the growth properties of the nanostructure and can provide a stable base for the grown nanostructures. The most commonly used metal catalysts are Fe, Ni, NiCr, Au, Pt, Pd and Co. A number of bimetallic catalyst to grow nanostructures using Co—V, Co—Fe, Co—Ni, Co—Pt, Co—Y, Co—Cu and Co—Sn are also effective. Different materials can be used under the catalyst layer to facilitate or control the properties of grown nanostructures as shown in our patent (WO 2006/115453). Growth of nanostructures can be performed but limited to chemical vapor methods. Chemical vapor deposition (CVD) methods such as RPECVD, thermal CVD, PECVD etc can be implemented for growth. The nanostructure can be made from a material selected from the group consisting of nanotube, nanowire, nanofiber, nanocone, nanowhisker and nanohorn or any other form of elongated nanostructures with high young modulus. The nanostructures can be made of carbon atoms or can be of materials selected from III-V, II-VI group of the periodic table such as, InP, GaAs, InGaAs, GaN, SiC, Si, ZnO and combination thereof. In one aspect of the invention, the grown nanostructures are not of the same type as the substrate they are grown from.

In one aspect of the invention, a help layer can be used for growing nanostructures on insulating substrate where the help layer can selectively be removed after growth as described in the patent application USA 61/031333. The nanostructures can then be grown from predefined catalyst layer if the growth is catalytically controlled.

In one aspect of the present invention, after growing the nanostructures, they can be subjected to coating with metals, semiconductor, semi-insulator, insulator or polymers to increase the functionality of the nanostructures for different applications. For example, the grown nanostructure can be coated with polymer to act as anti-sticking layer to improve the releasing mechanism of the stamp from the embossing material. In one aspect of the present invention, with a conductive stamp where the nanostructures are electrically conducting or coated with electrically conducting materials, electrochemical nanoimprint can be performed. Polymer coating of the nanostructures can be carried out to so as to obtain hydrophobic or hydrophilic surfaces of the nanostructures.

A further aspect of the invention relates to a method of lithography using a mask template comprising the steps of depositing a resist on a base substrate, contacting the mask template having formed nanostructure with the resist, applying a predefined vertical pressure to the mask template, and separating the mask template from the resist.

A still further aspect of the invention relates to the use of a template comprising a base substrate, and a catalyst layer deposited on the base substrate, wherein at least one nanostructure is grown from the catalyst layer defining a lithography profile, the aspect ratio of the nanostructures being controlled by growth of nanostructure, and said at least one nanostructure has such hardness to sustain the lithography profile of the nanostructure under vertical pressure, for perforating a material comprising depositing a layer of material to be perforated on the base substrate, contacting the template with the material, applying a predefined vertical pressure to the template, and separating the template from the material.

Replication: According to our present invention, only the first template for a given design is required to be manufactured by conventional e-beam/photo lithography and replications can be done. Once the first template is manufactured, templates can be manufactured by transferring the pattern to substrates by imprinting and subsequent growth of nanostructures. Moreover, in one aspect of the replication, the patterns, shapes and properties of the grown nanostructures can be controlled by the growth recipe. Further replication is anticipated by following the replication procedure. Thus from one single template, a large number of templates with different properties can be produced without using any further e-beam/photo lithography.

Low k dielectric: The International Technology Roadmap for Semiconductors predicts that continued scaling of devices will require ultra-low-k materials with k values less than 2.5 for the 100 nm technology node and beyond. It is discussed in the literature that incorporation of porosity into dense dielectrics is an attractive way to obtain ultra-low-k materials. One of the ways to obtain a lower dielectric constant is fluorination of either inorganic or organic dielectric materials. According to Jin C et al., the lowest dielectric constant available for fluorinated dense materials is around k~1.9 (Teflon) and none of the present approaches using dense materials is expected to achieve k values lower than that. However, air posses the lowest dielectric constant possible-k~1. Therefore, incorporation of air into dense materials to make them porous is a method to obtain ultra-low-k materials. The reduction of dielectric constant results from the incorporation air in pores and has the potential to drive the dielectric constant lower than k~2. To meet performance goals, future technology nodes will require materials with progressively lower dielectric constant. A change in dielectric material for each technology node increases process and equipment complexity and development cost. It is thus desirable to have one class of material that can meet the requirements for multiple future technology nodes. In another aspect of the present invention, the fabricated templates can be use for creating controllable low-k dielectric materials. Where a dielectric material is spin coated on a substrate. The template is pressed against the dielectric materials to make complete or partial holes, where the density, depth and sizes of holes are controlled by pressure, size of nanostructure templates and the aspect ratio of the nanostructure templates. Thus the perforated dielectric material will have dielectric constant that can be tuned as necessary. Therefore the present invention offers the extendibility to sustain multiple technology nodes since the present invention offers production of tunable dielectric materials.

Perforated materials: Perforated materials are used in a number of different applications for a variety of reasons. Used mostly as screens, filters, shields, and guards. While some applications may require that the perforated material has to perform in a certain way i.e. attenuate a sound frequency, provide a level of electromagnetic shielding, etc. Perforated materials can control the passage of air, liquid, light, solids, heat, molecules, bio-molecules, electromagnetic waves, and sound waves. A perforated material can also be a membrane where different terms exists such as semipermeable membrane, also termed a selectively-permeable membrane, a partially-permeable membrane or a differentially-permeable membrane. The membranes can be used for osmosis or reverse osmosis purposes. For example for reverse osmosis, semi permeable membranes are used for water purification or desalination systems. The artificial membranes are typically made from polyimide materials. They also have use in chemical applications such as batteries and fuel cells. Another example of a semipermeable membrane is dialysis tubing. In one aspect of the present invention, the fabricated template according to the present invention can be used to fabricate perforated materials by embossing or imprinting the template with a layer to be perforated. The materials can be from the group of metals, insulators or polymers. In one aspect, a material that needs to perforate is spun coated or sputtered, or evaporated on a substrate. The template according to the present invention is pressed on the coated materials like embossing or imprinting. As an alternative approach temperature of the coated layer can then be elevated to reach the glass transition temperature so that the layer can move freely around nanostructures template. The layer must then be cool down to a temperature lower than the glass transition temperature to complete the pattern transfer process, removing the template and creation of the perforation. The layer of material can then be lifted off from the substrate to release the membrane. Micro and/or nano fluidic devices can also be manufactured in a similar fashion as describe above.

In one aspect of the invention, the template according to the present invention is pressed on a metal layer like embossing or imprinting. And then in one aspect, the metal layers is subjected to high temperature such as in reflow, rapid thermal annealing (RTP), rapid thermal processing (RTP) to glue, bond or emboss the nanostructures on the metal materials.

Recyclable template: Today's template or stamp substrates can be used only once. When a pillar is broken from the stamp, the substrate is usually thrown away as trash and generates substrate waste. Alternatively even if the substrate is not broken (SiC case) and if only the template is damaged, reusing the substrate to make the same template become non-practical and non-economical. The present invention provides a method for an economical process to produce, enabling longer life time of the substrate, and enabling sustainable environment by facilitating reworkable and recyclable template for using the same substrate many times. Moreover, with the present invention it will even be possible to change the template design and keeping the same substrate by removing the grown nanostructures from the substrate, removing the catalyst layer from the substrate, deposition of catalyst according to the new template design and grown the nanostructures from the catalyst layer.

DETAILED DESCRIPTION OF EMBODIMENTS

Figure 2A:
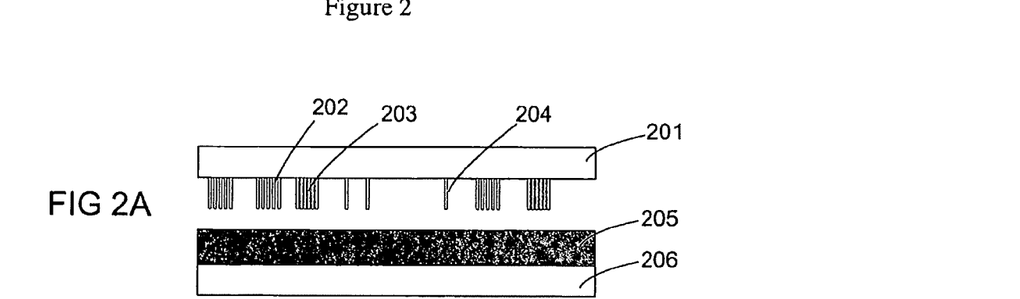
FIG. 2 Illustration of nanoimprint method using the nanostructure template.

A template 201 according to the present invention is shown in FIG. 2A. It has individual vertically aligned nanostructures 204. Also an array 202 of vertically aligned nanostructures and a forest of grown nanostructures 203 is also seen on the stamp. On a base substrate/wafer 206 is a polymer/resist 205 deposited. The substrate may include a number of layers.

Figure 2B:
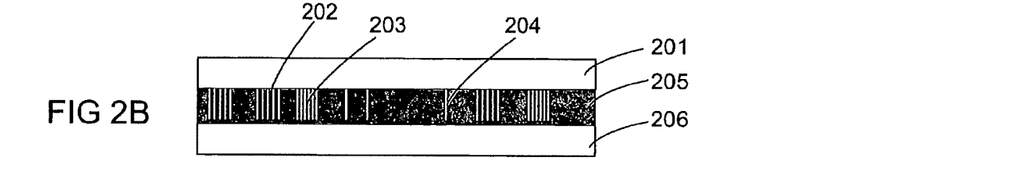
Figure 2C:
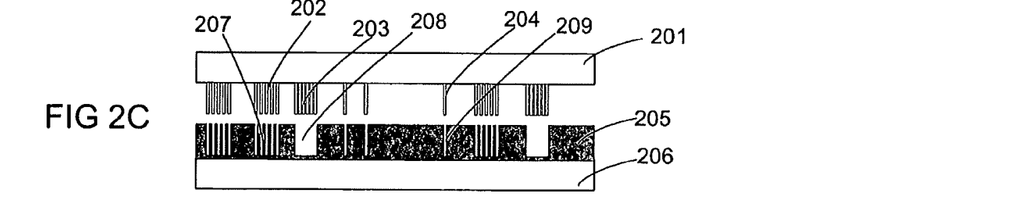
Figure 2D:
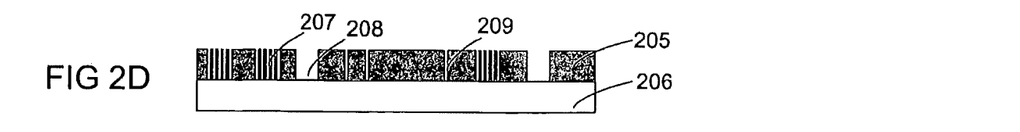

In FIG. 2B the template 201 according to the present invention is pressed towards the polymer layer 205 on the wafer 206. The wafer and the resist are heated above the glass transition temperature of the polymer. After cooling the template is lifted, leaving depressions 207, 208, and 209 in the resist layer. Dependent on the localization of the nanostructures, different types of results can appear in the imprinted polymer layer. For individual fiber 204 and for small-pitch arrays 202 as seen in FIG. 2A, each fiber will give a depression 207 and 209 in the polymer. For extremely small-pitch arrays 203, continuous depressions 208 will appear. This is used for creating wide depressions in the polymer layer.

Figure 3A:
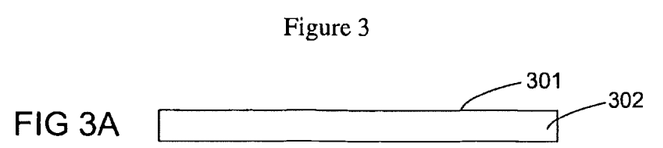
FIG. 3 Illustration of how to manufacture the nanostructure template stamp.
Figure 3B:
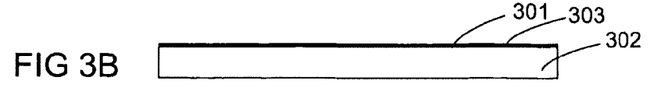
Figure 3C:
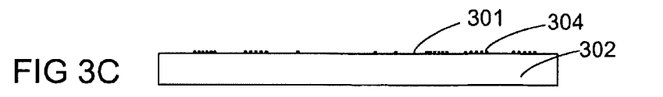
Figure 3D:
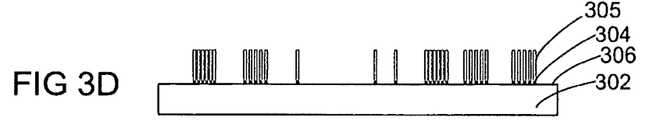

The template can be manufactured of a number of materials including, but not limited to, Si, SiOx, SiNx, silica, ceramic, glass, SiC, PDMS, polyimide, metals. In FIG. 3A a stamp blank 301 and 302 is seen. A catalyst layer 303 is deposited on the stamp blank 301, as seen in FIG. 3B. The catalyst layer is then patterned, resulting in the structure seen in FIG. 3C. This is done with standard lithography, which might include optical lithography, nanoimprint lithography, e-beam lithography etc. Etchback or lift-off processing can be used to pattern the catalyst. It is also possible to manufacture the stamp without lithography, as the catalyst can be a continuous layer, or the catalyst can be dispersed in a solution and spun on the stamp. Further, electroplating, electroless plating or catalyst particle spinning can be used to form the catalyst layer. Nanostructures 305 are grown on the stamp, as indicated in FIG. 3D.

Figure 3E:
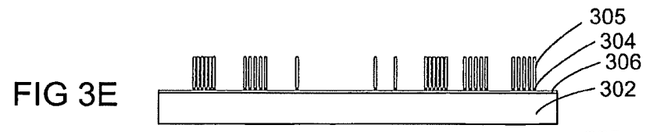
Figure 3F:
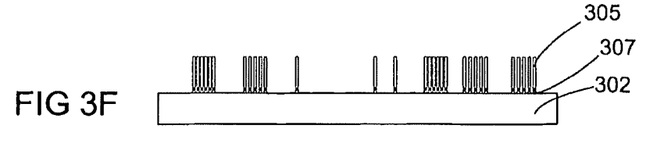

The resulting structure is seen in FIG. 3E. An example of this is using a glass stamp blank, which is electrically insulating. After the growth of the nanostructures, the help layer can be selectively removed by dry etching. The resulting structure is seen in FIG. 3F, and is useful for use with a glass stamp blank and ultra violet or x-ray nanoimprint in which the stamp must be transparent. For electrochemical nanoimprint lithography a conducting stamp is used. Then a metallic help layer is used during growth, but is not removed afterwards.

Figure 4:
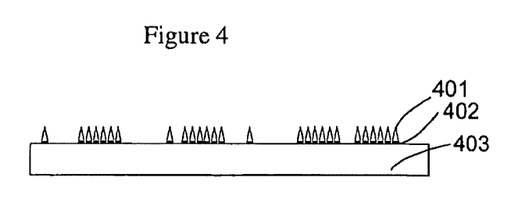
FIG. 4 Illustration of templates with different conical nanostructures.

The resulting nanostructures can be controlled by changing the growth parameters. For example conical nanostructures can be manufactured by using a low growth temperature. This structure is seen in FIG. 4 where 401 is conical shape of the grown nanostructures, 402 is the catalyst layer and 403 is the substrate.

Figure 5:
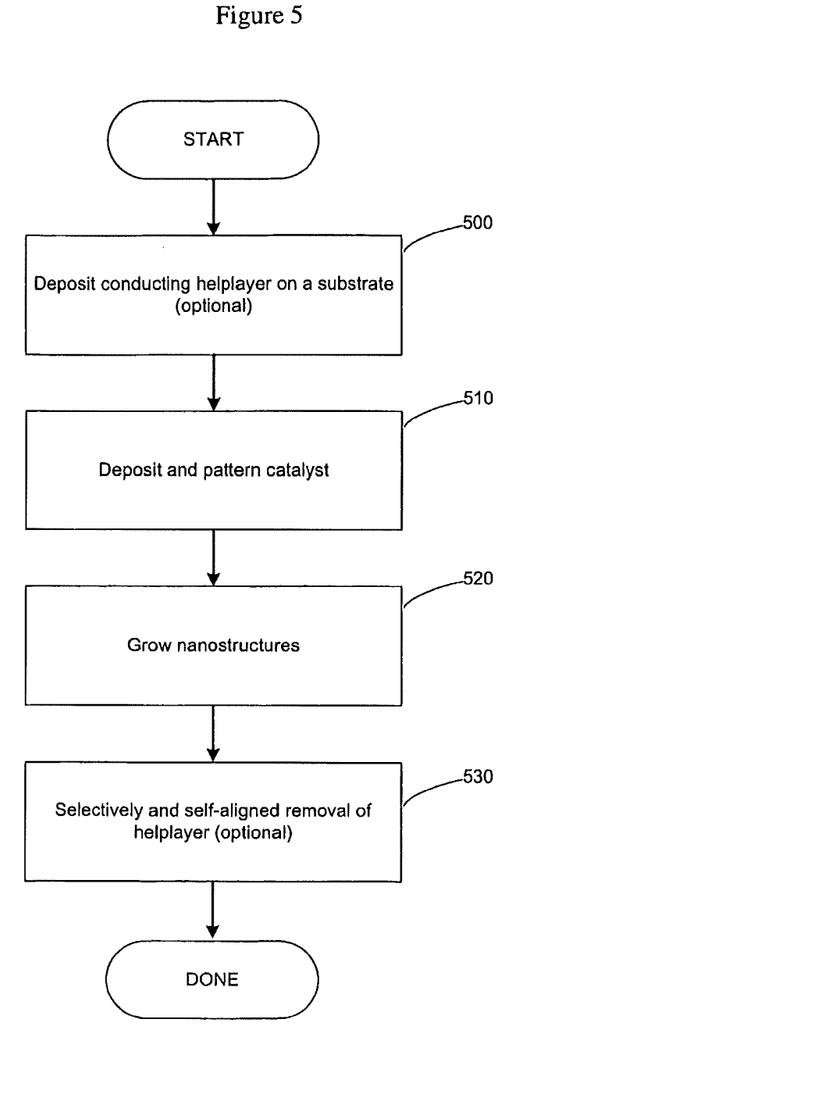
FIG. 5 Flowchart describing the template manufacture.

FIG. 5 shows an example of process plan for manufacturing templates based on the present invention.

EXAMPLES OF APPLICATIONS

The present invention discloses a method to manufacture a universal template for different applications. The template can be used for lithography, imprinting, embossing, recyclable/reworkable imprinting stamps. High aspect structure for fabricating trenches for capacitors or memory elements. For manufacturing honey comb structures, photonic crystals, sensors, detectors, solar cell applications, catalyst/catalytic chemistry, lab on a chip, x-ray, ionization sources, automobiles, telecommunications equipments, mobile phones, electronics, microprocessors, electronic packaging, bio sensors, membranes, perforated materials. The present innovation can be used among others for the same applications as standard nanoimprint, microelectronic, photonics.

Perforated Materials

According to the present invention, a perforated or semi-perforated material can be produced by first imprinting or embossing the template on the layer of material which needs to be perforated. Then the template is released from the layer of material. Afterwards, the filters can be used as filters in general, biologic applications, molecular filter for biomolecules, nano-fluidic applications lab-on-a-chip, due to the vertical alignment, manufacturing compact disks (CDs) or DVD disks.

The invention has applications for embedding nanostructures into other materials.

The invention also has photonic applications, and can be used to form materials transparent to light. Examples of such applications are anti-reflection coatings and Fresnel lenses.

The present innovation can be used to give a surface texture to materials. This can give hydrophobic surfaces with a large contact angle, the so-called lotus flower effect. The result can be controlled by the shape of the nanostructures of the stamp. For example nanostructures with conical shapes can be grown. Further the imprinted features can be used to improve adhesion between material layers, if given a suitable form.

The present invention can be used to manufacture reusable stamp for nanoimprint. For example, if the template is damaged, template is cleaned so that contaminants and fibers are removed and then nanostructures are grown again from existing catalyst layer or particles.

One advantage of the present innovation is that the fibers conduct electricity, which can give a conductive stamp for electrochemical nanoimprint lithography. Then a conducting stamp blank or a conducting help layer should be used. One other advantage is that the fibers conduct heat, and can be used to improve the heat conduction from the heater to the polymer during the imprint process.

Figure 6:
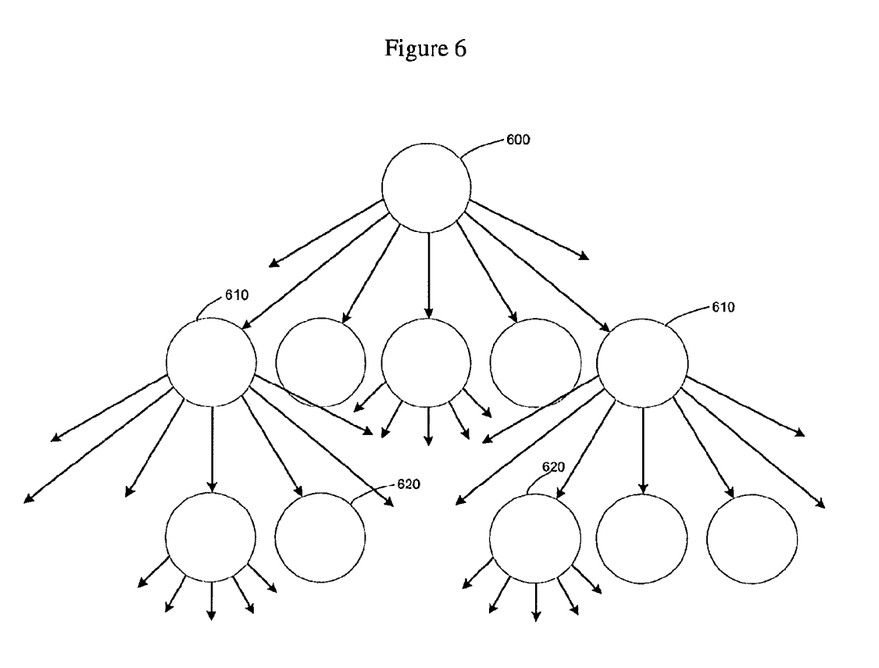
FIG. 6 Drawing describing template replication.

According to the present invention, self replication is possible as shown in FIG. 6. This enable several replications of the mask templates 610 and 620 from original template 600 to be formed which reduces dependencies on e-beam need for mass production of stamps, for example.

A number of embodiments of the invention have been described. It is however to be understood that various modifications may be made without departing from the spirit and scope of the present invention.

Demonstrator

Figure 7:
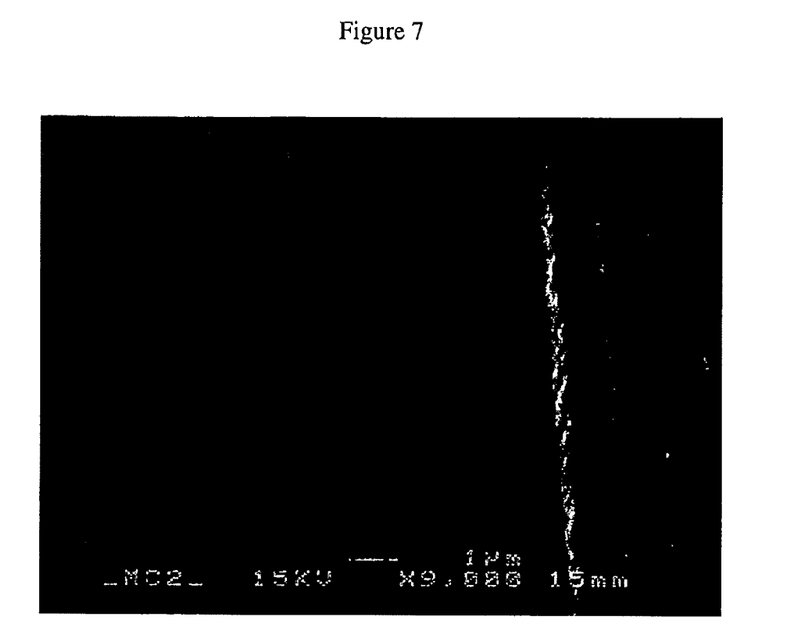
FIG. 7 SEM picture of a nanostructure stamp.
Figure 8:
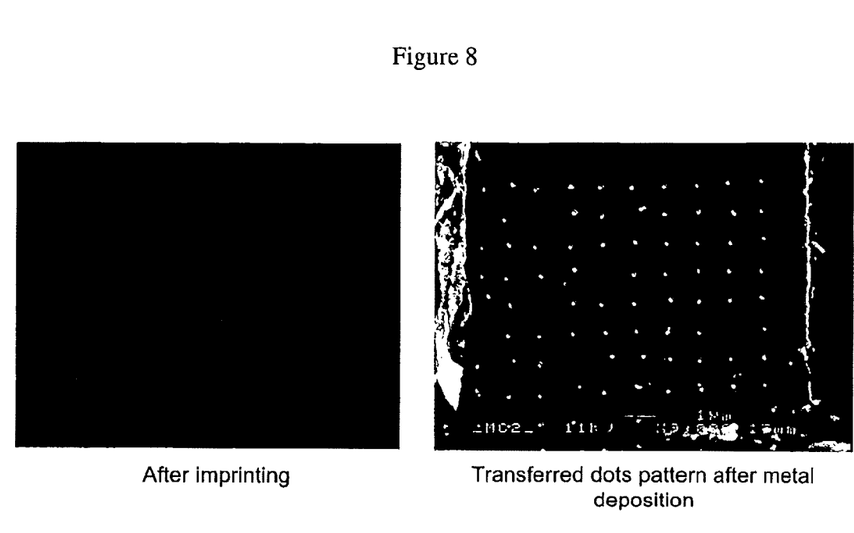
FIG. 8 Optical microscope picture of the resulting pattern in the resist layer.

In order to demonstrate the present innovation, a stamp with carbon nanofibers has been manufactured. A scanning-electron microscope (SEM) picture of it is seen in FIG. 7. It has been imprinted into a polymer layer, and the result is seen in FIG. 8. A metal layer (is patterned by depositing it onto an imprinted polymer layer, and the result is seen in FIG. 8.

DRAWINGS—REFERENCE NUMERALS 100 stamp
102 protrusions on the stamp
103 resist layer
104 oxide layer
105 wafer
106 resist layer after imprint
107 replication of protrusion on the stamp
108 resist layer after plasma ashing
109 oxide layer after etch
201 stamp substrate
202 grown nanostructures in forest
203 array of grown nanostructures with controlled density
204 individually grown nanostructure
205 resist layer
206 substrate for pattern transfer
207 replication of pattern from array of grown nanostructures
208 replication of pattern from forest like grown nanostructures
209 replication of pattern from individually grown nanostructure
301 layer on substrate
302 substrate
303 underlayer (optional)
304 patterned catalyst
305 grown nanostructures
306 after underlayer removal
307 after removal of a layer on substrate
401 grown conical nanostructures
402 catalyst layer
403 substrate
500 deposition of helplayer
510 deposition and patterning of catalyst
520 growth of nanostructures
530 elective removal of the helplayer (optional)
600 master stamp
610 second generation stamp with different properties
620 third generation stamp with different properties

What is claimed is:

1. A template comprising:
a base substrate;
a catalyst layer deposited on the base substrate; and
a plurality of nanostructures grown from the catalyst layer defining a lithography profile, the aspect ratio of the nanostructures being controlled by growth of nanostructure, and each of said plurality of nanostructures has such hardness to sustain the lithography profile of the nanostructure under vertical pressure, wherein
each of said nanostructures is substantially covered with a material in the form of a thin film selected from the group consisting of polymer, metal, semiconductor and insulator, and
the catalyst layer is patterned in a non-periodic pattern and comprised of at least one of: Fe, Ni, NiCr, Au, Pt, Pd, Co, Co—V, Co—Fe, Co—Ni, Co—Pt, Co—Y, Co—Cu, and Co—Sn.

2. The template according to claim 1, comprising a wherein a set of said plurality of nanostructures are grown sufficiently close together to collectively form a single continuous depression when the template is used for nano-imprint lithography.

3. The template according to claim 2, further comprising: a plurality of individual vertically aligned nanostructures; and at least one array of vertically aligned nanostructures, each of said vertically aligned nanostructures resulting in a single depression when the template is used for nano-imprint lithography.

4. The template according to claim 1, wherein the base substrate is made from a material selected from the group consisting of a silicon wafer, oxidized/coated silicon wafer, metal coated silicon wafer, nitride coated silicon wafer, silicon carbide wafer, glass substrate, ceramic, polymers, ITO, metal alloys.

5. A method of forming a template comprising the steps of:
providing a substrate;
transferring a template pattern to said substrate through imprinting using a template; and growing a plurality of nanostructures on the substrate, wherein the plurality of nanostructures are grown from a catalyst layer deposited on the substrate and define a lithography profile, the aspect ratio of the nanostructures being controlled by growth of nanostructure, and each of said plurality of nanostructures having such hardness to sustain the lithography profile of the nanostructure under vertical pressure, each of said nanostructures is substantially covered with a material in the form of a thin film selected from the group consisting of polymer, metal, semiconductor, and insulator, and the catalyst layer is patterned in a non-periodic pattern and comprised of at least one of: Fe, Ni, NiCr, Au, Pt, Pd, Co, Co—V, Co—Fe, Co—Ni, Co—Pt, Co—Y, Co—Cu, and Co—Sn.

6. The template according to claim 1, wherein said at least one nanostructure is made from a material selected from the group consisting of nanotube, nanowire, nanofiber, nanocone, nanowhisker and nanohorn.

7. The method according to claim 5, wherein said at least one nanostructure is made from a material selected from the group consisting of nanotube, nanowire, nanofiber, nanocone, nanowhisker and nanohorn.

8. The template according to claim 1, wherein the vertical pressure amounts to 1 bar to above 200 bars, preferably amounts to 1 bar to 60 bars.

9. The method according to claim 5, wherein the vertical pressure amounts to 1 bar to above 200 bars, preferably amounts to 1 bar to 60 bars.

10. The template according to claim 1, wherein said base substrate is made of a UV transparent material, the template further comprising:

a help layer arranged between the base substrate and the catalyst layer.

11. The method according to claim 5, wherein said base substrate is made of a UV transparent material, the template further comprising: a help layer arranged between the base substrate and the catalyst layer.

12. The method according to claim 5, wherein the base substrate is made from a material selected from the group consisting of a silicon wafer, oxidized/coated silicon wafer, metal coated silicon wafer, nitride coated silicon wafer, silicon carbide wafer, glass substrate, ceramic, polymers, ITO, metals and metal alloys.

* * * * *